US011620135B2

(12) United States Patent
Lee et al.

(10) Patent No.: US 11,620,135 B2
(45) Date of Patent: Apr. 4, 2023

(54) BOOTING METHOD OF COMPUTING SYSTEM INCLUDING MEMORY MODULE WITH PROCESSING DEVICE MOUNTED

(71) Applicant: SAMSUNG ELECTRONICS CO., LTD., Suwon-si (KR)

(72) Inventors: Jonggeon Lee, Seoul (KR); Kyungsoo Kim, Seoul (KR); Jinin So, Hwaseong-si (KR); Yongsuk Kwon, Goyang-si (KR); Jin Jung, Seoul (KR); Jeonghyeon Cho, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 175 days.

(21) Appl. No.: 17/115,924

(22) Filed: Dec. 9, 2020

(65) Prior Publication Data
US 2021/0349730 A1 Nov. 11, 2021

(30) Foreign Application Priority Data
May 7, 2020 (KR) .................. 10-2020-0054780

(51) Int. Cl.
*G06F 9/00* (2006.01)
*G06F 9/4401* (2018.01)
*G06N 20/00* (2019.01)

(52) U.S. Cl.
CPC ........... *G06F 9/4403* (2013.01); *G06N 20/00* (2019.01); *G06F 9/4401* (2013.01)

(58) Field of Classification Search
CPC ............................. G06F 9/4403; G06N 20/00
(Continued)

(56) References Cited

U.S. PATENT DOCUMENTS 7,647,467 B1 * 1/2010 Hutsell ............... G06F 13/4239
711/170
9,317,212 B2 4/2016 Huffman et al.
(Continued)

FOREIGN PATENT DOCUMENTS

KR      10-1726339 B1    4/2017
TW       201013686 A     4/2010
WO    WO 2019/061227     4/2019

OTHER PUBLICATIONS

Taiwanese Office action dated Jul. 21, 2022.

*Primary Examiner* — Volvck Derose
(74) *Attorney, Agent, or Firm* — Lee IP Law, P.C.

(57) ABSTRACT

A booting method of a computing system, which includes a memory module including a processing device connected to a plurality of memory devices, including: powering up the computing system; after powering up the computing system, performing first memory training on the plurality of memory devices by the processing device in the memory module, and generating a module ready signal indicating completion of the first memory training; after powering up the computing system, performing a first booting sequence by a host device, the host device executing basic input/output system (BIOS) code of a BIOS memory included in the computing system; waiting for the module ready signal to be received from the memory module in the host device after performing the first booting sequence; and receiving the module ready signal in the host device, and performing a second booting sequence based on the module ready signal.

20 Claims, 6 Drawing Sheets

(58) Field of Classification Search
USPC .............................................................. 713/2
See application file for complete search history.

(56) References Cited

U.S. PATENT DOCUMENTS

| | | | |
|---|---|---|---|
| 9,477,409 | B2 | 10/2016 | Ramanujan et al. |
| 9,792,190 | B2 | 10/2017 | Kumar et al. |
| 9,990,448 | B2 | 2/2018 | Wang et al. |
| 10,719,058 | B1* | 7/2020 | Johnson ............... G06F 13/1694 |
| 2010/0082967 | A1 | 4/2010 | Lo |
| 2012/0191964 | A1* | 7/2012 | Lee ..................... G06F 11/2289 |
| | | | 713/2 |
| 2012/0284576 | A1* | 11/2012 | Housty ............ G11C 29/50012 |
| | | | 711/155 |
| 2013/0103887 | A1* | 4/2013 | Frey .................... G06F 11/1441 |
| | | | 711/E12.001 |
| 2013/0179672 | A1 | 7/2013 | Lee et al. |
| 2014/0032826 | A1* | 1/2014 | Lee ...................... G11C 29/028 |
| | | | 711/104 |
| 2014/0324746 | A1* | 10/2014 | Foltin .................... G06F 12/00 |
| | | | 706/16 |
| 2015/0378603 | A1* | 12/2015 | Dearth ................. G06F 13/4072 |
| | | | 711/154 |
| 2016/0328156 | A1* | 11/2016 | Swarbrick ........... G06F 13/4234 |
| 2017/0110165 | A1* | 4/2017 | Kim ......................... G11C 8/18 |
| 2017/0345480 | A1* | 11/2017 | Chen ................... G11C 11/4094 |
| 2018/0018583 | A1* | 1/2018 | Cha ...................... G11C 29/023 |
| 2018/0204773 | A1* | 7/2018 | Jeong ................ H01L 27/11556 |
| 2019/0155547 | A1 | 5/2019 | Lee et al. |
| 2019/0163256 | A1 | 5/2019 | Lewis et al. |
| 2019/0371400 | A1 | 12/2019 | Farmahini Farahani et al. |
| 2020/0089630 | A1* | 3/2020 | Yamamoto ............. G11C 16/30 |
| 2021/0089461 | A1* | 3/2021 | Choi ........................ H03K 7/08 |
| 2022/0093197 | A1* | 3/2022 | Wu .................. G11C 29/12005 |

* cited by examiner

BOOTING METHOD OF COMPUTING SYSTEM INCLUDING MEMORY MODULE WITH PROCESSING DEVICE MOUNTED

CROSS-REFERENCE TO RELATED APPLICATION

Korean Patent Application No. 10-2020-0054780, filed on May 7, 2020, in the Korean Intellectual Property Office, and entitled: "Booting Method of Computing System Including Memory Module With Processing Device Mounted," is incorporated by reference herein in its entirety.

BACKGROUND

1. Field

Embodiments relate to a booting method of a computing system including a memory module with a processing device mounted.

2. Description of the Related Art

Computing systems provide capabilities and functions according to architectural configurations. Applications such as high performance and/or graphics algorithms are data- and compute-intensive.

SUMMARY

Embodiments are directed to a memory module, including: a printed circuit board; a plurality of memory devices coupled to the printed circuit board; and a processing device coupled to the printed circuit board and connected to the plurality of memory devices. When the memory module is powered-up, the processing device may perform memory training on the plurality of memory devices, generate a module ready signal after completing the memory training, and transmit the module ready signal to the outside of the memory module.

Embodiments are also directed to a computing system, including: a board; a host device mounted on the board; a memory module mounted on the board and connected to the host device, the memory module including a plurality of memory devices and a processing device connected to the plurality of memory devices; and a basic input/output system (BIOS) memory configured to store BIOS code for booting the computing system. When the computing system is powered up, the processing device of the memory module may perform memory training on the plurality of memory devices, generate a module ready signal after completing the memory training, and transmit the module ready signal to the host device.

Embodiments are also directed to a booting method of a computing system that includes a memory module including a processing device connected to a plurality of memory devices, the method including: powering up the computing system; after powering up the computing system, performing first memory training on the plurality of memory devices by the processing device in the memory module, and generating a module ready signal indicating completion of the first memory training; after powering up the computing system, performing a first booting sequence by a host device, the host device executing basic input/output system (BIOS) code of a BIOS memory included in the computing system; waiting for the module ready signal to be received from the memory module in the host device after performing the first booting sequence; and receiving the module ready signal in the host device, and performing a second booting sequence based on the module ready signal.

BRIEF DESCRIPTION OF THE DRAWINGS

Features will become apparent to those of skill in the art by describing in detail example embodiments with reference to the attached drawings in which.

DETAILED DESCRIPTION

Figure 1:
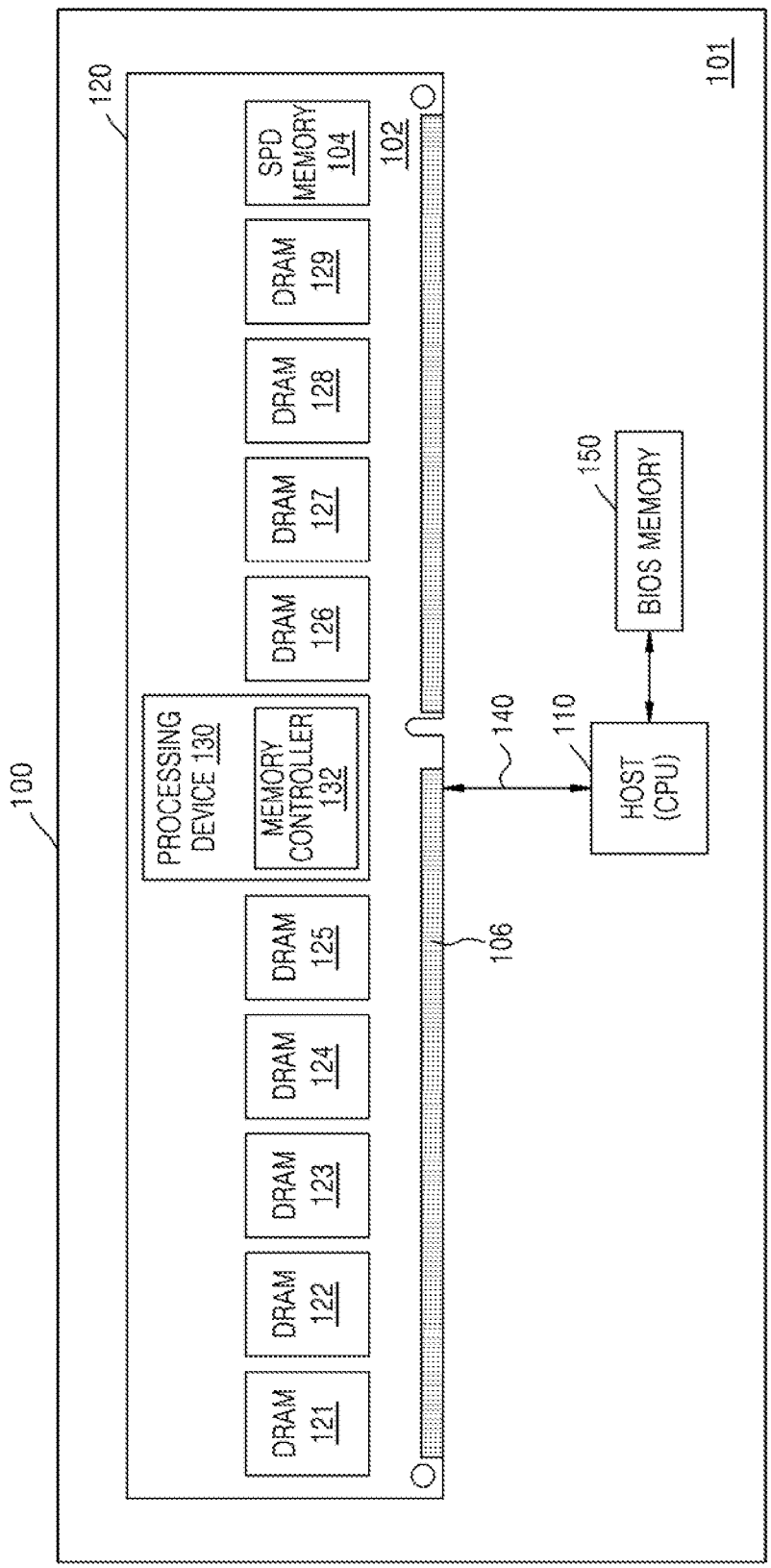
FIG. 1 is a block diagram conceptually illustrating a computing system including a memory module with a processing device mounted according to an example embodiment.

FIG. 1 is a block diagram conceptually illustrating a computing system including a memory module with a processing device mounted according to an example embodiment.

Referring to FIG. 1, a computing system 100 according to an example embodiment may include a host device 110, a memory module 120, and a Basic Input/Output System (BIOS) memory 150, which are mounted on a board 101. The host device 110 may be connected to and communicate with the memory module 120 through a memory bus 140.

Some examples may be described using the expressions "connected" and/or "coupled" together with their derivatives. These terms are not intended to be synonymous with each other. For example, a description using the terms "connected" and/or "coupled" may indicate that two or more elements are in direct physical or electrical contact with each other. In addition, the terms "connection" and/or "coupling" may mean that two or more elements are not in direct contact with each other, but still cooperate or interact with each other.

The host device 110 may be, e.g., a computing device such as a laptop computer, a desktop computer, a server computer, a workstation, a portable communication terminal, a Personal Digital Assistant (PDA), a Portable Multimedia Player (PMP), a smart phone, a tablet PC, and other suitable computers, a virtual machine, or a virtual computing device thereof. In an implementation, the host device 110 may be a part of components included in the computing system 100 such as a graphics card. The host device 110 may be a functional block that performs general computer operations in the computing system 100, and may correspond to a central processing unit (CPU), a digital signal processor (DSP) or an application processor (AP). In this specification, the host device 110 may be referred to as a CPU 110.

The CPU 110 may be configured to execute pieces of instructions or software, firmware, or combinations thereof executable by one or more machines. The CPU 110 may include any number of processor cores. For example, the CPU 110 may include a single-core or may include a multi-core such as a dual-core, a quad-core, and a hexa-core.

Although the computing system 100 including one CPU 110 is illustrated in FIG. 1, according to an embodiment, the computing system 100 may include a plurality of CPUs. The CPU 110 may be connected to the BIOS memory 150 through various interfaces such as a Serial Peripheral Interface (SPI) or a Low Pin Count (LPC) bus.

The BIOS memory 150 may store BIOS code for booting the computing system 100. The BIOS memory 150 may be implemented with a nonvolatile memory device. The nonvolatile memory device may be implemented with electrically Erasable Programmable Read-Only Memory (EEPROM), Flash Memory, Resistive RAM (RRAM), Magnetic RAM (MRAM), Phase Change RAM (PRAM), Ferroelectric RAM (FRAM), Nano Floating Gate Memory (NFGM), Polymer RAM (PoRAM), or a memory similar thereto.

The BIOS code may be or include Power On Self Test (POST) code and/or may be part of POST code that detects the hardware of the computing system 100, such as the board 101, the memory module 120, a keyboard, and a disk drive, and verifies that they are operating normally. The BIOS code may include memory reference code (MRC) for initializing the memory module 120. The MRC may include various algorithms configured to allow the CPU 110 to normally interoperate with the memory module 120.

Through the MRC executed by the CPU 110, Serial Presence Detect (SPD) data stored in an SPD memory device 104 of the memory module 120 may be read through the memory bus 140, and frequency, timing, driving, and detailed operation parameters for controlling the memory module 120 using SPD data may be set. The SPD data may include the type of the memory module 120, the type of memory device included in the memory module 120, operation timing information, manufacturing information, revision code, and serial number. Built-In Self-Test (BIST) and/or memory training of the memory module 120 may be performed by the MRC code.

For the sake of brevity, the memory bus 140 is illustrated as being connected by one signal line between the CPU 110 and the connecting pins 106 of the memory module 120, but it may be connected through a plurality of signal lines. The memory bus 140 may be implemented as one channel including a plurality of signal lines, or may be implemented as a plurality of channels. Also, one or more memory modules 120 may be connected to each channel.

The memory bus 140 may be composed of command/address signal lines transmitting commands/addresses and data lines transmitting data. Also, the memory bus 140 may include a module ready signal (RDY_DIMM in FIG. 2) line 250 (see FIG. 2) in which a signal is transmitted from the memory module 120 to the CPU 110.

The module ready signal RDY_DIMM indicates that memory training by a processing device 130 is completed after the memory training is performed between the processing device 130 and memory devices 121 to 129 in the memory module 120 during the booting operation of the computing system 100. The module ready signal RDY_DIMM may serve as a basic signal indicating that the CPU 110 is ready to perform secondary memory training after the memory devices 121 to 129 of the memory module 120 are primary memory trained by the processing device 130.

The memory module 120 may be configured to perform a processing function, and may include the processing device 130 coupled to a printed circuit board 102, the memory devices 121 to 129, and the SPD memory device 104. The memory module 120 may be implemented as a suitable type of memory module. For example, the memory module 120 may be implemented as a dual in-line memory module (DIMM), a Registered DIMM (RDIMM), Load Reduced DIMM (LRDIMM), Fully Buffered DIMM (FBDIMM), Small Outline DIMM (SODIMM), or the like.

The processing device 130 may operate as an accelerator or co-processor for the CPU 110. The processing device 130 may be implemented as a system-on chip (SoC) in which various functional blocks and/or a plurality of IPs are integrated in one semiconductor integrated circuit. IP refers to circuits, logic, or combinations thereof that may be integrated into SoCs.

The processing device 130 may server as an accelerator that efficiently performs a specific function of the CPU 110, and may include a Graphics Processing Unit (GPU), which is a functional block that specializes in processing graphic data, a Neural Processing Unit (NPU), which is a block for efficiently performing AI computations and inference, and/or a data processing unit (DPU), which is a block that specializes in data transmission.

The processing device 130 may include a memory controller 132 that controls data transmission and reception to/from the memory devices 121 to 129. The memory controller 132 may access the memory devices 121 to 129 according to the memory request of the processing device 130. According to an example embodiment, the memory controller 132 may access the memory devices 121 to 129 according to the memory request of the CPU 110. In this case, the memory controller 132 may be configured to allow the access of the memory devices 121 to 129 controlled by the CPU 110 to be transparent to the processing device 130.

The memory controller 132 may include a memory physical layer interface (PHY) 234 (see FIG. 2) for interfacing with the memory devices 121 to 129, such as selecting rows and columns corresponding to memory locations, writing data to memory locations, or reading written data.

The memory devices 121 to 129 may write data or read data under the control of the memory controller 132 in the processing device 130. For example, the memory devices 121 to 129 may be DRAM devices or any one of volatile memory devices such as Synchronous DRAM (SDRAM), Double Data Rate SDRAM (DDR SDRAM), Low Power Double Data Rate SDRAM (LPDDR SDRAM), Graphics Double Data Rate SDRAM (GDDR SDRAM), DDR2 SDRAM, DDR3 SDRAM, DDR4 SDRAM, DDR5 SDRAM, Wide I/O DRAM, High Bandwidth Memory (HBM), Hybrid Memory Cube (HMC), etc. Hereinafter, for convenience of description, the memory devices 121 to 129 are collectively referred to as DRAMs 121 to 129.

Figure 2:
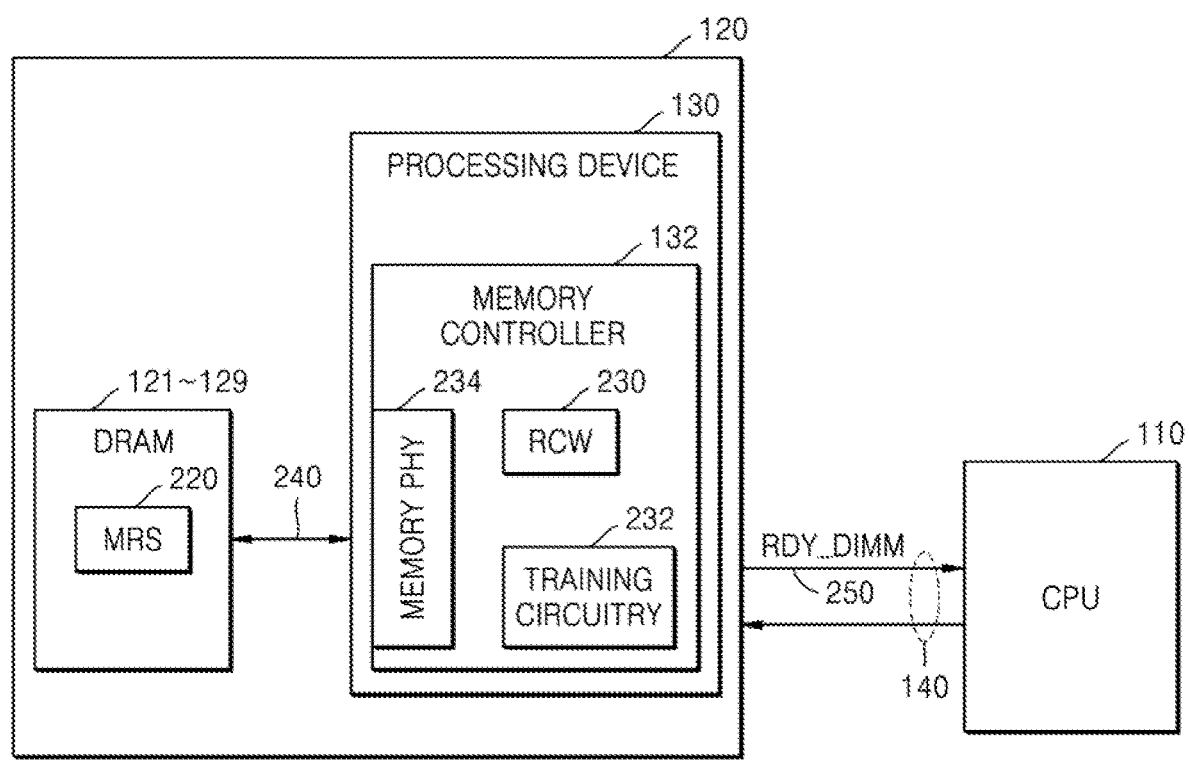
FIG. 2 is a block diagram illustrating a memory module of FIG. 1.

FIG. 2 is a block diagram illustrating the memory module of FIG. 1.

Referring to FIG. 2, the memory module 120 may include a processing device 130 including a memory controller 132 and DRAMs 121 to 129. The memory controller 132 may include a register control word (RCW) 230, a training circuitry 232, and a memory PHY 234.

The RCW 230 may be provided to control the initialization and/or operating characteristics of the memory module 120. The RCW 230 may include various algorithms that configure the memory controller 132 so that the memory controller 132 may normally interoperate with DRAMs 121 to 129. For example, code indicating the frequency, timing, driving, and detailed operation parameters of the DRAMs 121 to 129 may be set in the RCW 230. Memory training of the DRAMs 121 to 129 may be performed according to the code of the RCW 230.

The training circuitry 232 may perform memory core parameter training associated with the memory cores of the DRAMs 121 to 129 and/or peripheral circuit parameter training for the remaining peripheral circuits except the memory core under the control of the memory controller 132. The training circuitry 232 may determine optimal parameters for memory core parameters and/or peripheral circuit parameters of the DRAMs 121 to 129. The training circuitry 232 may perform memory training of the DRAMs 121 to 129 under the control of the memory controller 132.

The memory PHY 234 may include a physical or electrical layer and a logical layer provided for signals, frequency, timing, driving, detailed operation parameters, and functionality required for efficient communication between the memory controller 132 and the DRAMs 121 to 129. The memory PHY 234 may support features of the Joint Electron Device Engineering Council (JEDEC) standard DDR and/or LPDDR protocol.

The memory PHY 234 may connect the memory controller 132 to the DRAMs 121 to 129 through the memory interface 240. For the sake of brevity, the memory interface 240 is illustrated as being connected to one signal line between the memory controller 132 and the DRAMs 121 to 129, but may be actually connected through a plurality of signal lines. The memory interface 240 may include connectors for connecting the memory controller 132 to the DRAMs 121 to 129. The connectors may be implemented as pins, balls, signal lines, or other hardware components. For example, a clock signal, a command, an address, data, and the like may be transmitted and received between the memory controller 132 and the DRAMs 121 to 129 through the memory interface 240.

Each of the DRAMs 121 to 129 may include a mode register set (MRS) 220, a memory core, and other peripheral circuits except the memory core. The memory core may include a memory cell array, a row decoder, a column decoder, and a sense amplifier unit. The memory cell array may include a plurality of word lines and a plurality of bit lines, and a plurality of memory cells formed at a point where the word lines intersect with the bit lines. In an implementation, the row decoder enables the word line corresponding to the row address, the sense amplifier unit senses and amplifies data of the memory cells connected to the enabled word line and transmits the data to the bit lines, and the column decoder incrementally increases the received column address in a burst mode and selects bit lines corresponding to the incrementally increased column address.

The MRS 220 may be programmed to set a plurality of operating options, various functions, characteristics, and modes of DRAM. The MRS 220 may be programmed with appropriate bit values provided to the address bus of the memory interface 240 when an MRS command is issued from the memory controller 132.

For example, the MRS 220 may be used to control burst length BL, CAS latency CL, write leveling enable/disable, data terminal reference voltage (VrefDQ) training, and the like. The burst length BL may be provided to set the maximum number of column locations that may be accessed for read and/or write commands. The CAS latency CL may be provided to define the clock cycle delay between the read command and the first bit of valid output data. The write leveling may be provided to enable or disable skew compensation between a clock signal and a data strobe signal during a write operation. The VrefDQ training may be provided to set a reference voltage for reading data input or output to the data (DQ) terminals. The VrefDQ training may be trained based on a power supply voltage VDDQ driving input/output buffers connected to the data (DQ) terminals.

In addition, the MRS 220 may be used to control Delay Locked Loop (DLL) reset, DLL enable/disable, output drive strength, additive latency, Termination Data Strobe (TDQS) enable/disable, input/output buffer enable/disable, CAS light latency, dynamic termination, Light Cyclic Redundancy Check (CRC), Multi Purpose Register (MPR) location function, MPR operation function, gear down mode, MPR read format, power down mode, Vref monitoring, read preamble training mode, read preamble function, write preamble function, Command and Address (C/A) parity function, CRC error status, C/A parity error status, On Die Termination (ODT) function, data mask function, write Data Bus Inversion (DBI) function, read DBI function, Error Detection Code (EDC) Hold pattern, and the like, which are related to general functions, characteristics, and modes of DRAM.

According to an example embodiment, when the computing system 100 is powered up, the memory module 120 may perform first memory training for the DRAMs 121 to 129 by the processing device 130 inside the memory module 120. At the same time, the computing system 100 may execute booting operations to execute a portion of the BIOS code by the CPU 110 according to power-up.

Second memory training for DRAMs 121 to 129 of the memory module 120 may be included in booting operations for executing the BIOS code by the CPU 110. In an implementation of the second memory training, the first memory training may already be completed (that is, the second memory training may be performed after confirming that the memory module 120 is in a ready state), which may be beneficial in reducing the booting time of the computing system 100. In addition, by notifying the CPU 110 of the ready state of the memory module 120, a minimum boot time may be provided.

The memory controller 132 of the memory module 120 may output a module ready signal RDY_DIMM after the first memory training for the DRAMs 121 to 129 by the processing device 130 is completed. The training circuitry 232 may generate the module ready signal RDY_DIMM indicating memory training completion by performing the first memory training of the DRAMs 121 to 129. The memory module 120 may output the module ready signal RDY_DIMM to the outside of the memory module 120 through unused pins among the connecting pins 106 of the memory module 120. According to an example embodiment, the memory module 120 may output a module ready signal RDY_DIMM through a pin dedicated to the module ready signal among the connecting pins 106 of the memory module 120.

The module ready signal RDY_DIMM output from the memory module 120 may be transmitted to the CPU 110 through a dedicated signal line 250 formed on the board 101 of the computing system 100. The dedicated signal line of the module ready signal RDY_DIMM line 250 may be included in the memory bus 140 and transmitted to the CPU 110.

According to an example embodiment, the module ready signal RDY_DIMM may be transmitted to the CPU 110 through an interrupt signal line formed on the board 101 of the computing system 100. The CPU 110 may include a system management mode (SMM), and the SMM may allow the CPU 110 to operate in an alternative environment used to monitor and manage system resources and power usage, e.g., to execute certain system-level code. The SMM may be entered through a system management interrupt (SMI). The CPU 110 may include an SMI package pin, and the SMI package pin may be connected to an interrupt signal line. The CPU 110 may receive the module ready signal RDY_DIMM through the interrupt signal line and the SMI package pin. Reuse of the existing interrupt signal lines in the board 101 may save significant occupied space in the board 101 and avoid the cost of extending additional wires to the CPU 110. In addition, avoiding additional wires may eliminate potential electromagnetic interference (EMI) from the presence of the additional wires.

Figure 3:
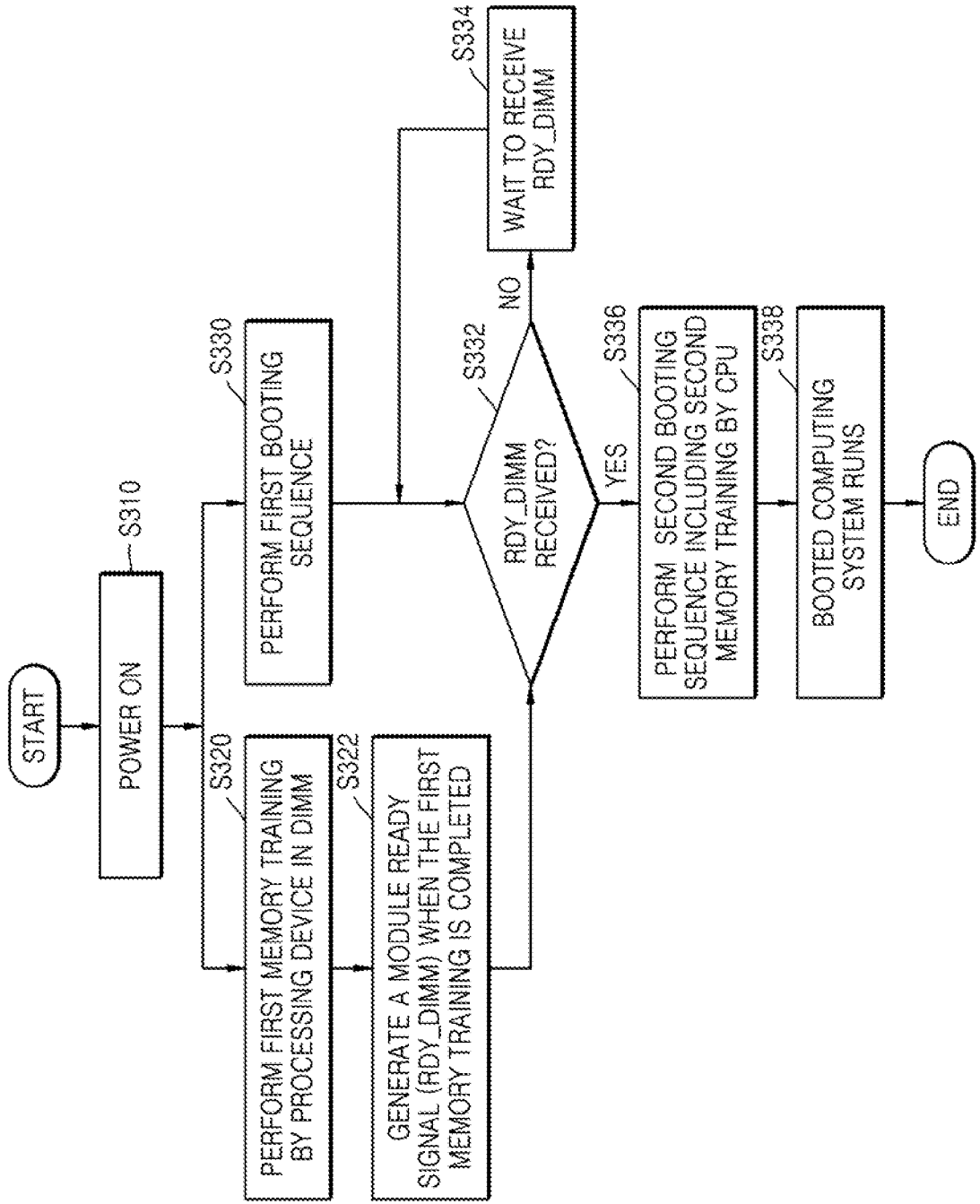
FIG. 3 is a flowchart illustrating a method of booting a computing system, according to an example embodiment.

FIG. 3 is a flowchart illustrating a method of booting a computing system, according to an example embodiment.

Referring to FIG. 3 in relation to FIGS. 1 and 2, in operation S100, power may be supplied to the computing system 100 and the computing system 100 may be powered up (S100). Operation S100 may include a case in which the computing system 100 is reset or the power state of the computing system 100 is transitioned. According to an example embodiment, when the computing system 100 is powered up, for the correct operation of the computing system 100, a Power-On-Reset (POR) operation on hardware components of the computing system 100 may be performed. For example, when the power supply voltage level provided to the memory module 120 is stably kept constant, for correct operation of the memory module 120, the processing device 130, and the DRAMs 121 to 129 may perform a POR operation.

After the computing system 100 is powered up, the booting operation of the computing system 100 may be divided into first booting operations S320 and S322 executed by the processing device 130 in the memory module 120 and second booting operations S330, S332, S334, S336, and S338 in which the BIOS code read from the BIOS memory 150 is executed by the CPU 110. The first booting operations executed by the processing device 130 may be performed simultaneously with some of the second booting operations executed by the CPU 110. The rest of the second booting operations executed by the CPU 110 may proceed after checking the module ready state of the memory module 120.

After the computing system 100 is powered up, the memory module 120 may perform first memory training by the processing device 130 (S320). The training circuitry 232 of the memory controller 132 in the processing device 130 may perform training for the DRAMs 121 to 129. For example, clock training, address training, write/read leveling, write/read re-center training, and the like may be performed. Detailed description of the first memory training by the processing device 130 in operation S320 will be described with reference to FIG. 4.

When the first memory training S320 by the processing device 130 is completed, the memory module 120 may generate a module ready signal RDY_DIMM indicating that the first memory training is completed, i.e., after completing the first memory training for the DRAMs 121 to 129 in the training circuitry 232 (S322). The module ready signal RDY_DIMM may be transmitted to the CPU 110.

After the computing system 100 is powered up, the CPU 110 may perform a first booting sequence for the computing system 100 (S330). The first booting sequence may be configured to read stored ID information on the CPU 110, the memory module 120, and the computing system board 101. According to an example embodiment, stored ID information may be read from the SPD memory device 104 included in the memory module 120 or read from the BIOS memory 150. The BIOS code included in the BIOS memory 150 may include instructions for reading stored ID information on the CPU 110, the memory module 120, and the computer system board 101. The CPU 110 may extract IDs, e.g., serial numbers, of the CPU 110, the memory module 120, and the computing system board 101 by executing the BIOS code. A detailed description of the first booting sequence in operation S330 will be described with reference to FIG. 5.

After performing the first booting sequence (S330), the CPU 110 may check whether the module ready signal RDY_DIMM is received from the memory module 120 (S332). If the module ready signal RDY_DIMM is not received (S332: No), that is, if the first memory training for the DRAMs 121 to 129 by the processing device 130 in the memory module 120 is not completed, then the CPU 110 may wait until the first memory training by the processing device 130 is completed and the module ready signal RDY_DIMM is received, as indicated by S332 and S334 loops (S334).

If the module ready signal RDY_DIMM is received from the memory module 120 (S332: Yes), that is, if the first memory training for the DRAMs 121 to 129 by the processing device 130 in the memory module 120 is completed, then the CPU 110 may perform a second booting sequence for the computing system 100 (S336). The second booting sequence may be configured to initialize the memory module 120 by the CPU 110 and perform second memory training for the DRAMs 121 to 129. The second memory training for the DRAMs 121 to 129 by the CPU 110 may be similar to the first memory training for the DRAMs 121 to 129 by the processing device 130, which is performed in operation S320. The second memory training for the DRAMs 121 to 129 by the CPU 110 may include, e.g., clock training, address training, write/read leveling, write/read re-center training, and the like. A detailed description of the second booting sequence in operation S360 will be described with reference to FIG. 6.

If the second booting sequence for the computing system 100 by the CPU 110 is completed successfully and no hardware malfunction is detected, then the booted computing system 100 is activated. The computing system 100 may execute various computing functions.

In the booting method of the above-described computing system, after performing the memory training primarily between the processing device 130 in the memory module 120 and the DRAMs 121 to 129, memory training is performed secondarily between the CPU 110 and the DRAMs 121 to 129. As memory training of DRAMs 121 to 129 is performed twice, it is possible to more fully ensure stability of the computing system.

Figure 4:
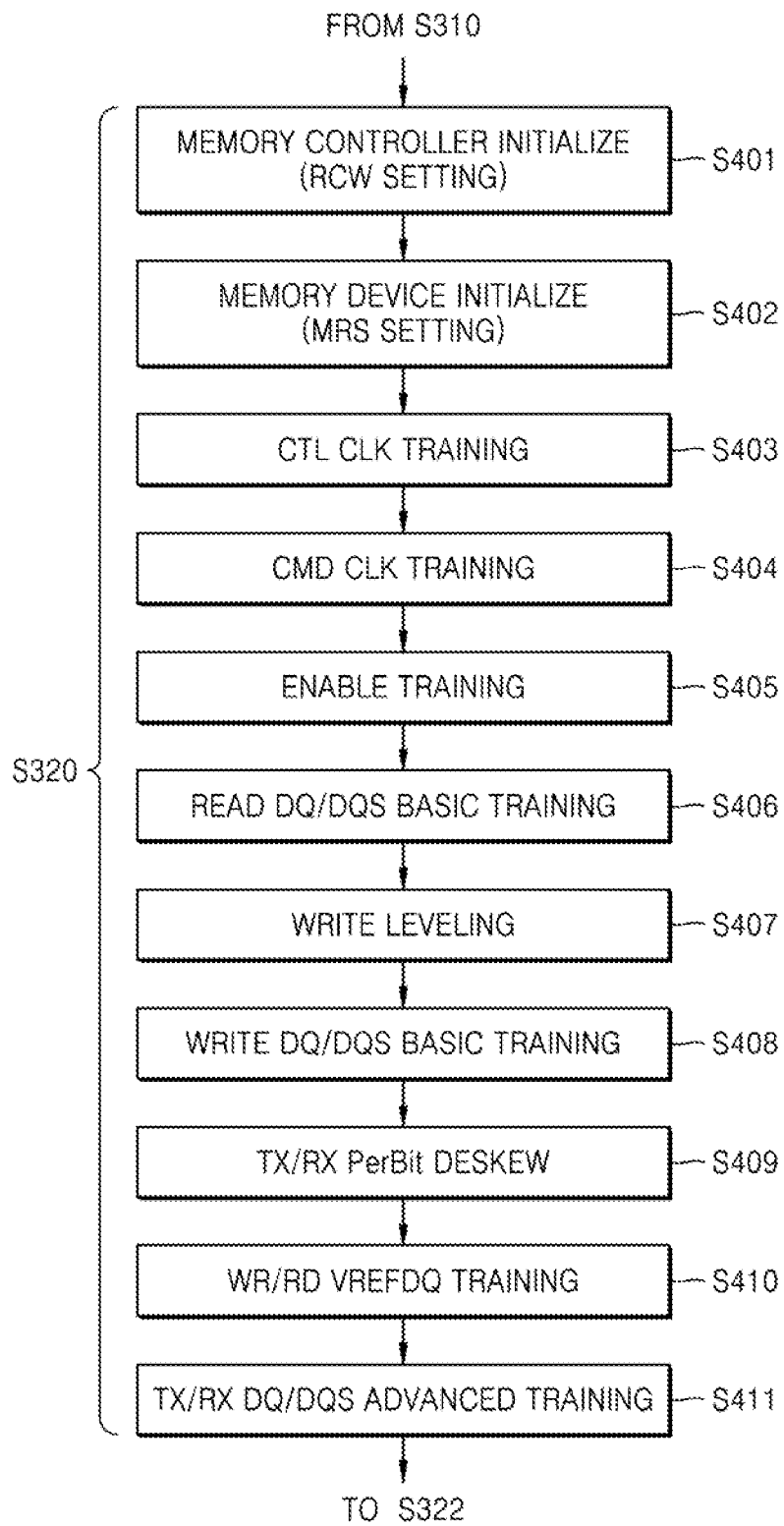
FIG. 4 is a flowchart for specifically describing first memory training by a processing device in a memory module of FIG. 3.

FIG. 4 is a flowchart for specifically describing the first memory training (S320) by a processing device in the memory module of FIG. 3.

Referring to FIGS. 2, 3, and 4, as the computing system 100 is powered up, the memory module 120 may be powered up (S310). After the memory module 120 is powered up, the memory controller 132 may set the RCW 230 to control the initialization and/or operation characteristics of the DRAMs 121 to 129 (S401). The memory controller 132 may store code indicating the frequency, timing, driving, and detailed operation parameters of the DRAMs 121 to 129 in the RCW 230 to normally interoperate with the DRAMs 121 to 129.

The DRAMs 121 to 129 may set the MRS 220, which sets a plurality of operation options, various functions, characteristics, and modes of the DRAMs 121 to 129 (S402). For example, codes for setting burst length BL, CAS latency CL, MPR operation function, MPR read format, write leveling, VrefDQ training, read/write DBI function, and the like may be set in the MRS 220.

The training circuitry 232 of the memory controller 132 may perform clock training for control signals CTL through the memory interface 240 (S403). The control signals CTL may include a chip select signal CS, a clock enable signal CKE, a row address strobe signal RAS, a column address strobe signal CAS, and a write enable signal WE. The clock training may be performed so that the control signals CTL transmitted from the memory controller 132 may be received by the DRAMs 121 to 129 in synchronization with the clock signal CLK.

The training circuitry 232 of the memory controller 132 may perform the clock training for commands CMD through the memory interface 240 (S404). The commands CMD may include a precharge command, an active command, a read command, and a write command. The clock training may be performed so that the commands CMD transmitted from the memory controller 132 may be received by the DRAMs 121 to 129 in synchronization with the clock signal CLK.

The memory controller 132 may perform training of reception (or receive) enable for recognizing a signal received by the DRAMs 121 to 129 through the memory interface 240 (S405). The DRAMs 121 to 129 may provide the training circuitry 232 with a reception enable signal recognizing the reception of signals transmitted from the memory controller 132. The training circuitry 232 may include a buffering and timing circuit to keep the assertion of the receive enable signal consistent with the transmission of the signal from the memory controller 132. The assertion timing of the reception enable signal in the training circuitry 232 may be determined during the reception enable training process.

The training circuitry 232 of the memory controller 132 may perform basic data strobe signal (DQS) training on the data DQ output from the DRAMs 121 to 129 through the memory interface 240 (S406). When the data strobe signal DQS of the DRAMs 121 to 129 is output to the memory controller 132 together with the data DQ, the training circuitry 232 may perform read re-center training so that the data strobe signal (DQS) edge is centered in the data (DQ) window.

The clock training for control signals CTL in operation S403, the clock training for commands CMD in operation S404, the training for reception enable in operation S405, and/or the data strobe signal (DQS) training for data DQ in operation S406 may be performed using the MPR operation function of the MRS 220 and the MPR reading format. The clock training for the control signals CTL, the clock training for the commands CMD, and the reception enable training may be performed by reading a preset timing calibration bit sequence in the MPR. In addition, the data strobe signal (DQS) training for the data DQ may be trained by reading a preset data pattern in the MPR. The trainings of operations S403 to S406 are parameter trainings in the peripheral circuit using MPR, instead of using the memory cores of the DRAMs 121 to 129.

The training circuitry 232 of the memory controller 132 may receive a write leveling command associated with a write operation of the DRAMs 121 to 129 through the memory interface 240, and perform write leveling to compensate for skew between the received clock signal CLK and the data strobe signal DQS (S407). Write leveling is a function of sampling the data strobe signal DQS output from the memory controller 132 using a clock signal CLK, and detecting the phase relationship between the data strobe signal DQS and the clock signal CLK to adjust the delay time of the data strobe signal DQS.

The training circuitry 232 of the memory controller 132 may perform training of the data strobe signal DQS for the data DQ input to the DRAMs 121 to 129 through the memory interface 240 (S408). When the data strobe signal DQS is input from the memory controller 132 together with the data DQ, the DRAMs 121 to 129 may perform write re-center training so that the data strobe signal (DQS) edge is centered in the data (DQ) window.

The training circuitry 232 of the memory controller 132 may perform a write/read data deskew operation of reducing a data input/output time difference between data DQ input or output to/from the DRAMs 121 to 129 through the memory interface 240 (S409). Because the effective data window decreases when skew is increased between write data DQ in the write mode, the DRAMs 121 to 129 may perform a write data deskew operation to compensate for data skew in order to secure an effective data margin. Because the effective data window decreases when skew is increased between read data DQ in the read mode, the DRAMs 121 to 129 may perform a read data deskew operation to compensate for data skew in order to secure an effective data margin.

The training circuitry 232 of the memory controller 132 may perform VrefDQ training to set a reference voltage (VrefDQ) level for reading data DQ input or output to/from the DRAMs 121 to 129 through the memory interface 240 (S410). The DRAMs 121 to 129 may train a training value of the reference voltage VrefDQ, a training range of VrefDQ, and the like. The DRAMs 121 to 129 may perform VREFDQ training such that the reference voltage (VrefDQ) level comes in the middle of the data (DQ) eye diagram shown as overlapping of a plurality of data (DQ) transitions.

In order for the memory controller 132 to properly identify the data read from the DRAMs 121 to 129, it is important to determine the time when the read data is valid. In order for DRAMs 121 to 129 to properly identify write data received from the memory controller 132, it is important to determine the time when the write data is valid. For this, a predetermined preamble time indicating whether the data DQ is valid before inputting or outputting the data DQ to the data strobe signal DQS may be set. The training circuitry 232 of the memory controller 132 may perform advanced data strobe signal (DQS) training on the data DQ input or output to/from the DRAMs 121 to 129 through the memory interface 240 (S411).

The training circuitry 232 may perform enable training to enable the data strobe signal DQS to have one clock cycle or two clock cycle preamble time before inputting the data DQ according to the write command or before outputting the data DQ according to the read command. Enabling training for the data strobe signal DQS may perform an operation of adjusting the delay of the DLL until the assertion of the enable signal matches the preamble indication in the data strobe signal DQS.

The trainings of operations S408 to S411 may be core parameter trainings using a memory core of the DRAMs 121 to 129. The training circuitry 232 may complete peripheral circuit parameter training and core parameter training of the DRAMs 121 to 129, and store optimized peripheral circuit parameters and core parameters in a parameter storage area. The parameter storage area may be, e.g., an extended mode register set (EMRS) or a separate parameter register unit, or a nonvolatile memory such as flash memory, EPROM, EEPROM, or the like. The DRAMs 121 to 129 may write or read data in an environment set with optimized peripheral circuit parameters and core parameters stored in the parameter storage area.

Figure 5:
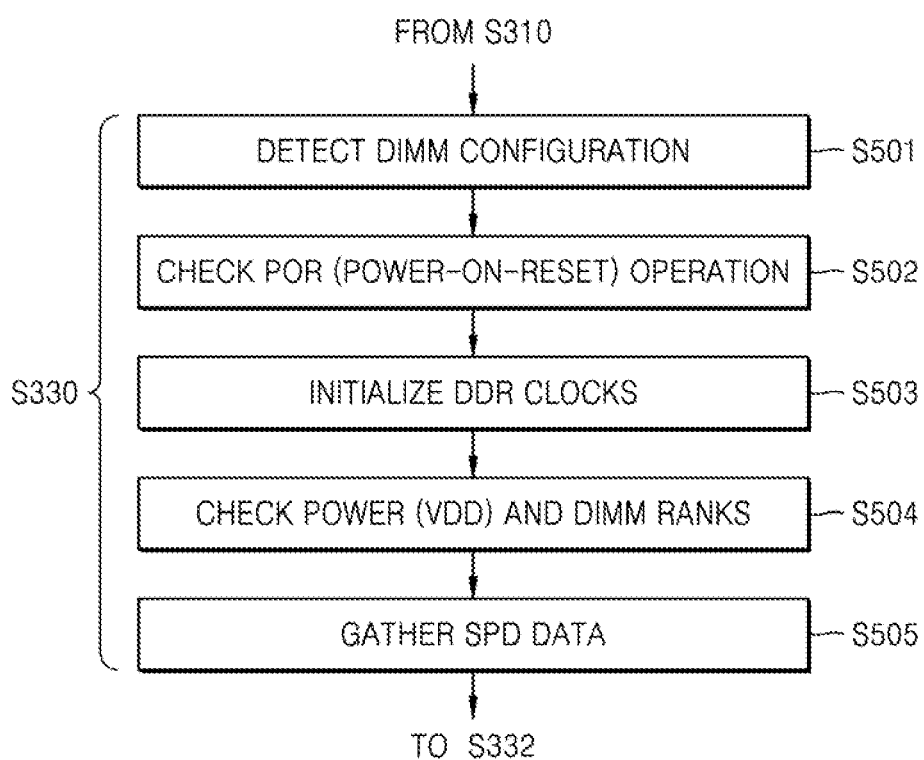
FIG. 5 is a flowchart specifically illustrating a first booting sequence performed by a CPU of FIG. 3.

FIG. 5 is a flowchart specifically illustrating a first booting sequence S330 performed by the CPU of FIG. 3.

Referring to FIGS. 1, 3, and 5, after the computing system 100 is powered up, the CPU 110 may detect hardware configurations of the computing system 100. The CPU 110 may detect the configuration of the memory module 120 among hardware configurations (S501). The CPU 110 may check the type and/or memory attribute of the memory module 120. The type of the memory module 120 may be any one of RDIMM, LRDIMM, FBDIMM, and SODIMM. The memory attribute may be composed of the number of ranks, data width, data bandwidth, and the like. For example, the memory attribute may be composed of 1 Rank, x4, 1600 MHz, and the like.

For correct operation of the computing system 100, the CPU 110 may check a power-on reset (POR) operation performed on hardware components of the computing system 100 after power-up (S502). In particular, the CPU 110 may check the POR operation performed on the processing device 130 and the DRAMs 121 to 129 for the correct operation of the memory module 120.

The CPU 110 may initialize double-data-rate (DDR) clocks of the computing system 100 (S503). The CPU 110 may check the power supply voltage VDD of the computing system 100 and the rank of the memory module 120 (S504). The CPU 110 may obtain SPD data stored in the SPD memory device 104 included in the memory module 120 (S505). The SPD data may include the type of the memory module 120, the type of memory device included in the memory module 120, operation timing information, manufacturing information, revision code, and serial number.

After power-up of the computing system 100, the first booting sequence performed by the CPU (S330) may include detecting the configuration of the memory module 120 (S501), checking the POR operation (S502), initializing DDR clocks (S503), checking the power supply voltage VDD and the rank of the memory module 120 (S504), and obtaining the SPD data (S505). In the present example embodiment, the first booting sequence S330 performed by the CPU is described as five operations, but the first booting sequence S330 may further include various operations.

After performing the first booting sequence (S330), the CPU 110 may check whether the module ready signal RDY_DIMM is received from the memory module 120 (S332), wait until the module ready signal RDY_DIMM is received (S334), and perform the second booting sequence S336 when the module ready signal RDY_DIMM is received.

Figure 6:
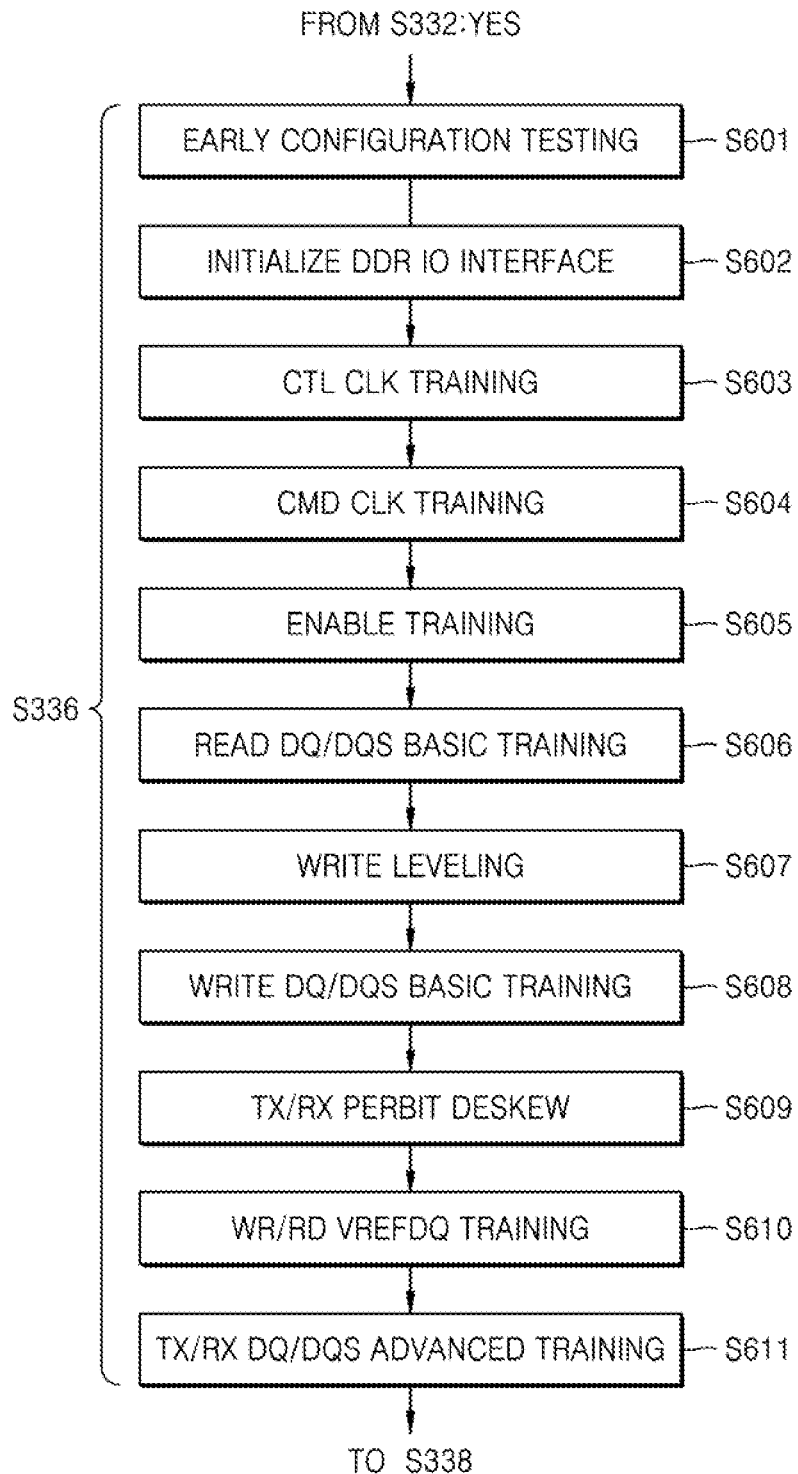
FIG. 6 is a flowchart specifically illustrating a second booting sequence performed by a CPU of FIG. 3.

FIG. 6 is a flowchart specifically illustrating a second booting sequence S336 performed by the CPU of FIG. 3.

Referring to FIGS. 1, 3 and 6, the CPU 110 may check that the module ready signal RDY_DIMM is received from the memory module 120 (S332: Yes), and test the components of the computing system 100 (S601). For example, the CPU 110 may perform a coarse test on clocks provided to components of the computing system 100. The CPU 110 may perform a coarse test to synchronize the phases of clock signals and maintain a constant operating frequency.

The CPU 110 may initialize the input/output interface of the DRAMs 121 to 129 of the memory module 120 (S602). At this time, the memory controller 132 of the memory module 120 may be configured to allow the input/output interface of the DRAMs 121 to 129 controlled by the CPU 110 to be transparent to the processing device 130 of the memory module 120.

After the input/output interface of the DRAMs 121 to 129 of the memory module 120 is initialized (S602), the CPU 110 may perform second memory training for the DRAMs 121 to 129. The input/output interface initialization and the second memory training for the DRAMs 121 to 129 by the CPU 110 may be similar to the first memory training S320 for the DRAMs 121 to 129 by the processing device 130 of the memory module 120 described in FIG. 4.

Initializing the input/output interface of the DRAMs 121 to 129 by the CPU 110 (S602) may include operations similar to an operation of setting the RCW 230 so that the memory controller 132 in operation S401 of FIG. 4 matches the initialization and/or operation characteristics of the DRAMs 121 to 129, and an operation of setting the MRS 220 setting a plurality of operation options, various functions, characteristics, and modes of the DRAMs 121 to 129 in operation S402.

Thereafter, the CPU 110 may perform second memory training for the DRAMs 121 to 129. The CPU 110 may perform clock training on the control signals CTL of the DRAMs 121 to 129 (S603). Performing clock training on the control signals CTL of the DRAMs 121 to 129 by the CPU 110 (S603) may be similar to the clock training operation performed so that the control signals CTL transmitted from the memory controller 132 in operation S403 of FIG. 4 may be received to the DRAMs 121 to 129 in synchronization with the clock signal CLK.

The CPU 110 may perform clock training for the commands CMD of the DRAMs 121 to 129 (S604). Performing the clock training on the commands CMD of the DRAMs 121 to 129 by the CPU 110 (S604) may be similar to a clock training operation performed so that commands CMD transmitted from the memory controller 132 in operation S404 of FIG. 4 may be received to the DRAMs 121 to 129 in synchronization with the clock signal CLK.

The CPU 110 may perform reception enable training for recognizing signals received in the DRAMs 121 to 129 (S605). Performing reception enable training for recognizing a signal received by the DRAMs 121 to 129 by the CPU 110 (S605) may be similar to a reception enable training operation in which assertion of a reception enable signal recognizing reception of signals transmitted from the memory controller 132 in operation S405 of FIG. 4 is performed to match transmission of a signal from the memory controller 132.

The CPU 110 may perform basic data strobe signal (DQS) training on the data DQ output from the DRAMs 121 to 129 (S606). Performing the basic data strobe signal (DQS) training on the data DQ output from the DRAMs 121 to 129 by the CPU 110 is performed (S606) may be similar to a read re-center training operation performed such that the data strobe signal (DQS) edge is centered in the data (DQ) window when the data strobe signal DQS of the DRAMs 121 to 129 in operation S406 of FIG. 4 is output to the memory controller 132 together with the data DQ.

The CPU 110 may perform write leveling associated with the write operation of the DRAMs 121 to 129 (S607). Performing the write leveling in association with the write operation of the DRAMs 121 to 129 by the CPU 110 (S607) may be similar to an operation of sampling the data strobe signal DQS output from the memory controller 132 of step S407 of FIG. 4 as a clock signal CLK, and detecting the phase relationship between the data strobe signal DQS and the clock signal CLK to adjust the delay time of the data strobe signal DQS.

The CPU 110 may perform training of the data strobe signal DQS for the data DQ input to the DRAMs 121 to 129 (S608). Performing the training of the data strobe signal DQS for the data DQ input to the DRAMs 121 to 129 by the CPU 110 (S608) may be similar to the operation of performing write re-center training such that the data strobe signal (DQS) edge is centered in the data (DQ) window when the data strobe signal DQS is input from the memory controller 132 to the DRAMs 121 to 129 in operation S408 of FIG. 4 together with the data DQ.

The CPU 110 may perform a write/read data deskew operation to reduce a data input/output time difference between data DQ input or output to/from the DRAMs 121 to 129 (S609). Performing a write/read data deskew operation to reduce a data input/output time difference between data DQ input/output to/from the DRAMs 121 to 129 by the CPU 110 (S609) may be similar to the write data deskew operation and read data deskew operation in operation S409 of FIG. 4.

The CPU 110 may perform VrefDQ training to set a reference voltage (VrefDQ) level for reading data DQ input or output to/from the DRAMs 121 to 129 (S610). Performing the VrefDQ training to set a reference voltage (VrefDQ) level for reading data DQ input or output to/from DRAMs 121 to 129 by the CPU 110 (S610) may be similar to the operation of performing VREFDQ training such that the reference voltage (VrefDQ) level comes in the middle of the data (DQ) eye diagram in operation S410 of FIG. 4.

The CPU 110 may perform the data strobe signal (DQS) training to set a predetermined preamble time indicating whether the data DQ is valid before the data DQ input or output to/from the data strobe signal DQS of the DRAMs 121 to 129 (S611). Performing the data strobe signal (DQS) training to set a predetermined preamble time indicating whether the data DQ is valid before inputting or outputting the data DQ to the data strobe signal DQS of the DRAMs 121 to 129 by the CPU 110 (S611) may be similar to an operation of performing enable training to allow the data strobe signal DQS to have one clock cycle or two clock cycle preamble time before inputting the data DQ according to the write command in operation S411 of FIG. 4 or before outputting the data DQ according to the read command and adjusting the delay of the DLL until the assertion of the enable signal matches the preamble indication in the data strobe signal DQS.

The memory controller 132 may complete the second memory training of the DRAMs 121 to 129 by the CPU 110 and store optimized peripheral circuit parameters and core parameters of the DRAMs 121 to 129 in the parameter storage area.

By way of summation and review, applications such as deep neural networks may use computing systems with large computational and memory capabilities to more accurately train or learn different data sets. Considering an increase in training data sets, an increase in model parameters, and an increase in intermediate results of processing, such a computing system may include a memory module equipped with a processing device used for training an artificial neural network or artificial intelligence together with memory-centric dynamic random access memory (DRAM). When the computing system is booted, as part of the Power On Self Test (POST), training and/or testing of memory modules included in the computing system may be performed.

A memory module including a processing device may use interface tuning operations between processing devices and DRAMs in the memory module and, after the interface tuning operations between the processing device and DRAMs are completed, the host device may be notified. Accordingly, a computing system including a memory module with a processing device mounted may be implemented with a new boot sequence at boot time.

As described above, embodiments may provide a memory module with a processing device mounted, a computing system including the memory module, and a booting method of the computing system.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory module, comprising:
   a printed circuit board;
   a plurality of memory devices coupled to the printed circuit board; and
   a processing device coupled to the printed circuit board and connected to the plurality of memory devices,
   wherein the processing device is configured to:
      after the memory module is powered-up, perform first memory training on the plurality of memory devices,
      generate a module ready signal that indicates completion of the first memory training, after completing the first memory training, and
      transmit the module ready signal to a host device that is outside of the memory module, the module ready signal causing the host device to perform a second booting operation after the host device performs a first booting operation, the first booting operation including executing basic input/output system (BIOS) code of a BIOS memory.

2. The memory module as claimed in claim 1, wherein the module ready signal is output to the outside of the memory module through unused pins among connecting pins of the memory module.

3. The memory module as claimed in claim 1, wherein the module ready signal is output to the outside of the memory module through a pin dedicated to the module ready signal among connecting pins of the memory module.

4. The memory module as claimed in claim 1, wherein:
   the processing device includes a memory controller that controls the first memory training for the plurality of memory devices, and
   the memory controller performs the first memory training using a training circuitry and generates the module ready signal.

5. The memory module as claimed in claim 1, wherein the memory module is a dual in-line memory module.

6. A computing system, comprising:
   a board;
   a host device mounted on the board;
   a memory module mounted on the board and connected to the host device, the memory module including a plurality of memory devices and a processing device connected to the plurality of memory devices; and
   a basic input/output system (BIOS) memory configured to store BIOS code for booting the computing system, wherein:
   the processing device is configured to, after the computing system is powered up:

perform first memory training on the plurality of memory devices, and generate a module ready signal that indicates completion of the first memory training, after completing the first memory training, and transmit the module ready signal to the host device, and the host device is configured to, after the computing system is powered up:

perform a first booting sequence that includes executing the BIOS code of the BIOS memory, after performing the first booting sequence, wait for the module ready signal to be received from the memory module, and perform a second booting operation in response to receiving the module ready signal from the memory module.

7. The computing system as claimed in claim 6, wherein the memory module outputs the module ready signal to the outside of the memory module through an unused pin among connecting pins of the memory module.

8. The computing system as claimed in claim 6, wherein the memory module outputs the module ready signal to the outside of the memory module through a pin dedicated to the module ready signal among connecting pins of the memory module.

9. The computing system as claimed in claim 6, wherein the module ready signal is transmitted to the host device through an interrupt signal line formed on the board.

10. The computing system as claimed in claim 6, wherein the module ready signal is transmitted to the host device through a module ready signal line formed on the board.

11. A booting method of a computing system that includes a memory module including a processing device connected to a plurality of memory devices, the method comprising:

powering up the computing system;

after powering up the computing system, performing first memory training on the plurality of memory devices by the processing device in the memory module, and generating a module ready signal indicating completion of the first memory training;

after powering up the computing system, performing a first booting sequence by a host device, the host device executing basic input/output system (BIOS) code of a BIOS memory included in the computing system;

waiting for the module ready signal to be received from the memory module in the host device after performing the first booting sequence; and receiving the module ready signal in the host device, and performing a second booting sequence based on the module ready signal.

12. The method as claimed in claim 11, wherein the performing of the first memory training and the performing of the first booting sequence are performed in parallel.

13. The method as claimed in claim 11, wherein:

the first booting sequence is configured to read ID information on hardware components of the computing system, and the first booting sequence includes checking a type and memory attribute of the memory module from a serial presence detect memory of the memory module.

14. The method as claimed in claim 13, wherein the memory module is a dual in-line memory module.

15. The method as claimed in claim 11, wherein the second booting sequence includes performing second memory training on the plurality of memory devices of the memory module by the host device.

16. The method as claimed in claim 15, wherein the second memory training performed by the host device is configured to perform transparently for the processing device.

17. The method as claimed in claim 11, further comprising, after performing the first memory training, outputting the module ready signal from the memory module to the outside of the memory module through an unused pin among connecting pins of the memory module.

18. The method as claimed in claim 11, further comprising, after performing the first memory training, outputting the module ready signal from the memory module to the outside of the memory module through a pin dedicated to the module ready signal among connecting pins of the memory module.

19. The method as claimed in claim 11, further comprising transmitting the module ready signal to the host device through an interrupt signal line formed on a board of the computing system.

20. The method as claimed in claim 11, further comprising transmitting the module ready signal to the host device through a module ready signal line formed on a board of the computing system.

* * * * *